BINARY CODE CONVERSION
Filed Nov. 27, 1959 3 Sheets-Sheet 1
| | A | B | C | | a | b | c | d | e |
|---|---|---|---|---|---|---|---|---|---|
| 1 | 0 | 0 | 0 | = | 1 | 1 | 0 | 0 | 0 |
| 2 | 0 | 0 | 1 | = | 1 | 0 | 1 | 0 | 0 |
| 3 | 0 | 1 | 0 | = | 1 | 0 | 0 | 1 | 0 |
| 4 | 0 | 1 | 1 | = | 1 | 0 | 0 | 0 | 1 |
| 5 | 1 | 0 | 0 | = | 0 | 1 | 0 | 0 | 1 |
| 6 | 1 | 0 | 1 | = | 0 | 1 | 0 | 1 | 0 |
| 7 | 1 | 1 | 0 | = | 0 | 1 | 1 | 0 | 0 |
| 8 | 1 | 1 | 1 | = | 0 | 0 | 1 | 1 | 0 |
FIG. 1
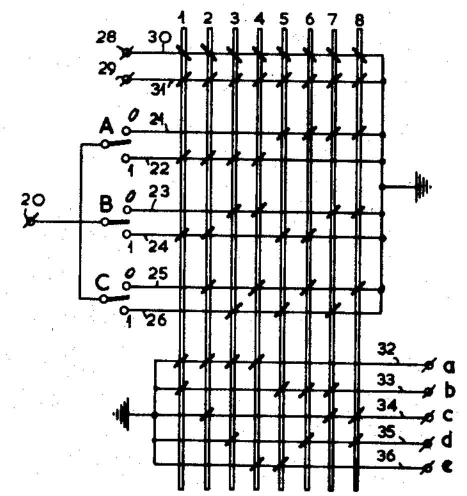
FIG. 2
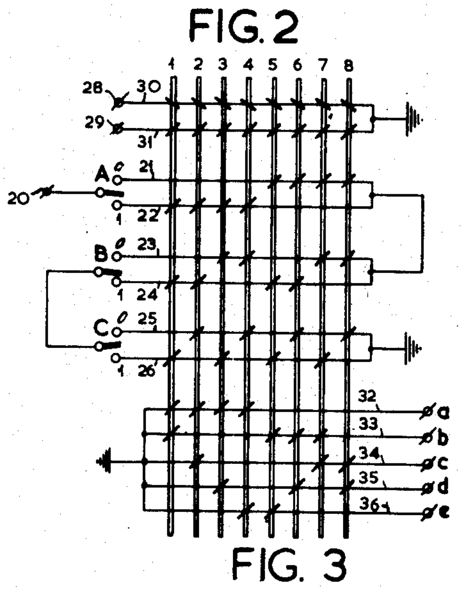
FIG. 3
INVENTORS
W. F. BROK
F. J. SCHRAMEL
BY
Frank R. Jinfani
AGENT

BINARY CODE CONVERSION

Filed Nov. 27, 1959 3 Sheets-Sheet 2

INVENTOR
W. F. BROK
F. J. SCHRAMEL

BY
Frank R. Jufani
AGENT

BINARY CODE CONVERSION

Filed Nov. 27, 1959

INVENTOR
W. F. BROK
F. J. SCHRAMEL
BY Frank R. Trifari
AGENT

United States Patent Office 3,123,816
Patented Mar. 3, 1964

3,123,816
BINARY CODE CONVERSION

Franz Josef Schramel, Hilversum, and Wilhelm Fredrik Brok, Voorburg, Netherlands, assignors to North American Philips Company, Inc., New York, N.Y., a corporation of Delaware Filed Nov. 27, 1959, Ser. No. 855,859
Claims priority, application Netherlands Dec. 2, 1958
6 Claims. (Cl. 340—347)

The invention relates to an arrangement for converting code groups having binary code elements into different code groups also having binary code elements. More particularly, the invention has for its object to provide a simple arrangement for converting an arbitrary code into an arbitrary different code, for example an $m$-out-of-$n$-code into a $p$-out-of-$q$-code, in which neither $m$ nor $p$ has the value 1. However, the invention is not restricted to these special codes.

In accordance with the invention this is achieved in that each code element place of the conversions corresponds to an output wire which is connected to outputs of bistable memory elements so that it is connected to an output relating to a given state of at least one memory element of each group of bistable memory elements; the memory element corresponds to a conversion which has the sign 1 at the code element place indicated by the output wire concerned, but which element is not connected to any of the further memory elements, so that each memory element is connected only to output wires which, at the conversion of the code group to be converted and corresponding to the said memory element, must have a voltage, the arrangement being such that the outputs of the various elements are adequately decoupled relatively to each other. By slightly extending the arrangement it is possible to construct the device so that the conversion is delivered sequentially, regardless of whether the code group to be converted is furnished to the device simultaneously or sequentially. For certain uses, for example, in telegraphy, the sequential delivery of the converted code may be desirable or even necessary.

A few embodiments of the invention will be described more fully with reference to the drawing.

FIG. 1 shows in the form of a table a simple example of the conversion of an arbitrary code with three code element places and binary code elements into code groups of a 2-out-of-5-code.

FIGS. 2 and 3 show two embodiments of the conversion indicated in the table, in which the converted code is delivered simultaneously.

Figure 4:
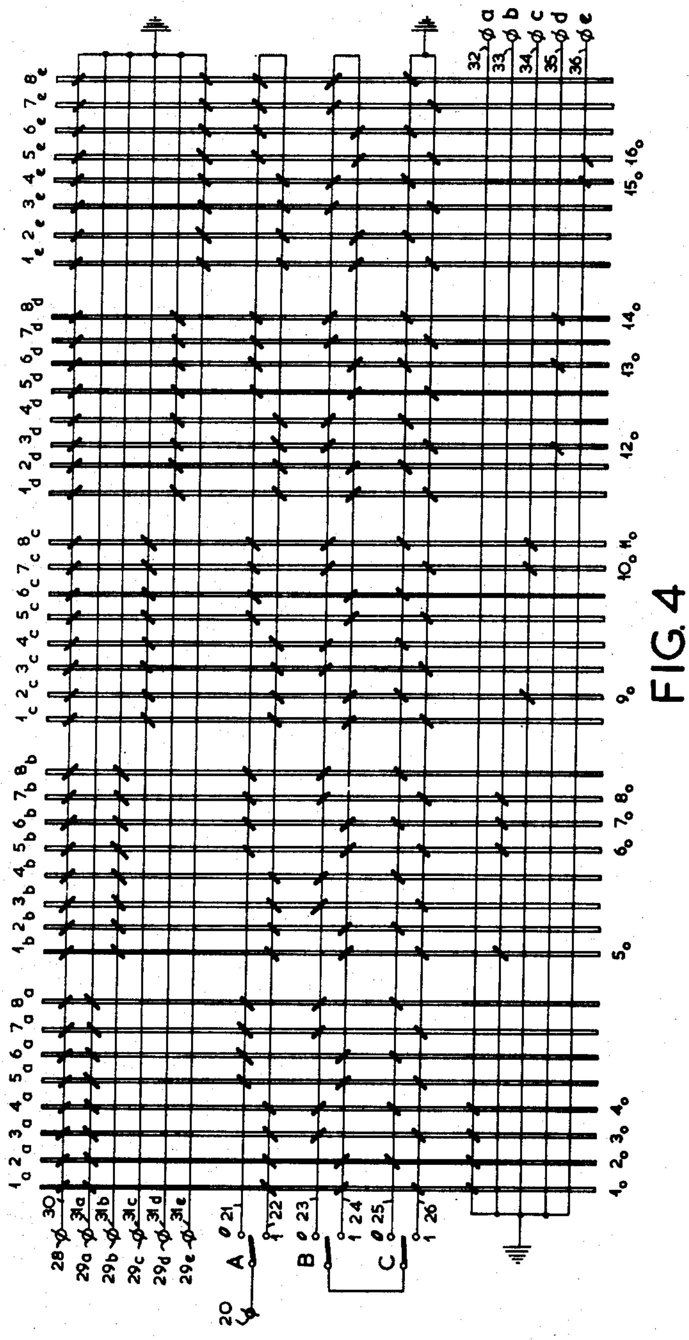
FIGS. 4 and 5 show two embodiments of the same conversion, in which the converted code is delivered sequentially.

The term "code" is to be understood to mean herein the registration of given information in finite groups of a finite number of available signs; the signs may occur several times but need not all occur. A binary coded information is a group of only two kinds of signs, in this case the digits 0 and 1. A group of these signs representing a given piece of information, for example 011, 010, is termed a code group. The signs forming the code group, in this example the signs 0, 1, 1, 0, 1, 1, 0 are termed the code elements. The order of succession of the code elements is important, so that the code groups 011010 and 101010 are different even though both code groups contain the sign 0 three times and the sign 1 three times. Each code element therefore has a specified place in the code group, the place also determining the meaning of the code element in the code group similarly to the figures of a number. Therefore, a code group has a number of code element places where the digit 0 or 1 may be found. Hereinafter we will deal only with codes whose code groups all comprise the same number of code element places. The term $m$-out-of-$n$-code is to be understood to mean a code of which each code group comprises $n$ code element places at $n—m$ of which is found the figure 0 and at $m$ of which is found the figure 1.

The word sign is to be considered as a very general term, so that it is also understood to comprise states of a mechanism or a circuit, voltages at a point, currents passing through a wire, and so on.

The representation of code groups in other code groups is termed the conversion of the code into another code. The first-mentioned code groups are termed the code groups to be converted, the code groups corresponding to the code groups to be converted are termed the conversions thereof. The correspondence between the code groups need not be 1–1, although this will usually be the case.

FIG. 1 is an example of a 1–1-correspondence of the $2^3=8$ different code groups with three binary code elements into code groups comprising five binary code elements, in which each conversion has three figures 0 and two figures 1 (2-out-of-5 code). Since the conversion or 2-out-of-5 code contains $C_5^2=10$ different code groups, two of these code groups will not represent conversions of a code group with three binary code elements; in the example of FIG. 1, these are the code groups (00101) and (00011).

FIG. 2 shows the diagram of an arrangement for carrying out the conversion indicated in the table of FIG. 1. In this figure, reference numerals 1, 2, 3, 4, 5, 6, 7 and 8 designate rings of a magnetic material having a substantially hysteresis loop, which operate as memory elements. Each ring corresponds to a code group of three code elements and hence also to the conversion thereof. Thus, for example, the ring 6 corresponds to the code group on line 6 of FIG. 1, hence to the code groups (101) and (01010). The code element places of the code groups to be translated correspond to three change-over contacts A, B and C, which may be mechanical or electronic and may be controlled in known manner; they are therefore not further described. They may be, for example, relay-controlled change-over contacts or change-over contacts of polar relays. The code element place corresponding to the change-over contact A is indicated in FIG. 1 by the character A, and so on. Each change-over contact has one input and two outputs, the latter being designated by the references 0 and 1. The input of a change-over contact is connected in its own contact either to the output 0, which indicates that at the corresponding code element place there occurs the figure 0, or to the output 1, which indicates that the figure 1 occurs at the corresponding code element place. Each of the eight code groups with three code elements thus corresponds to a given combination of positions of the change-over contacts. The inputs of the three change-over contacts are connected to an input terminal 20, the outputs to write wires 21, 22 . . . 26, which are threaded through the eight rings in a particular manner and then connected to ground. If, for example, the input of change-over contact B is connected to the output 0, then the write wire 23 connected to this output is considered marked. Consequently, in each combination of positions of the three change-over contacts, three of the six write wires 21, 22 . . . 26 are marked. The fact that a wire is threaded through a ring is indicated in FIG. 2 by a small oblique dash. The write wires 21, 22 . . . 26 are threaded through the eight rings in such a manner that, in each combination of positions of the three change-over contacts, every ring except one is threaded with at least one marked wire; none of the marked wires is threaded through the excepted ring. The excepted ring to be converted, i.e. the code group indicated by the particular combination of positions of the change-over contacts. Taking, by way of example, the code group 4, i.e. the code group 011, then the change-over contact A is in the position 0 (which means that its input is connected to the output 0) and the change-over contacts B and C are both in the position 1. The write wires 21, 24 and 26 are then marked. From FIG. 2 it is evident that none of the marked wires is threaded through the ring 4 but at least one marked wire is threaded through all other rings. The manner in which the write wires 21, 22 . . . 26 are to be threaded through the rings, is as follows. Through the ring 3, for example, which corresponds to the code group (010) to be converted, there must not be threaded the write wires 21, 24 and 25, which are connected to the outputs 0. 1 and 0 of the change-over contacts A, B and C. However, the write wires 22, 23 and 26, which are connected to the outputs 1, 0 and 1 of the change-over contacts A, B and C, must be threaded through this ring. In the combination of positions of the change-over contacts A, B and C, indicated by the code groups (010) no marked write wire is threaded through the ring 3, but in any other combination of positions of the change-over contacts at least one marked write wire passes through the ring 3.

To the five code element places of the translations indicated in FIG. 1 by the characters *a*, *b*, *c*, *d*, *e* there correspond, in the arrangement shown in FIG. 2, five output wires 32, 33, 34, 35, 36. Considering any of the five code element places, for example the code element place *d*, it is evident from FIG. 1 that this code element place contains the figure 1 in the code groups 3, 6 and 8 and the figure 0 in the other groups 1, 2, 4, 5 and 7. The output wire 35 corresponding to this code element place is therefore threaded through the rings 3, 6 and 8, but not through the rings 1, 2, 4, 5 and 7. Finally the arrangement comprises a reset wire 30 and a readout wire 31; the former is threaded through all rings and is connected on the one hand to the input terminal 28 and on the other hand to ground. The readout wire 31 is also threaded through all rings and is connected to the input terminal 29 and to ground.

"To offer a code group for conversion" means in this arrangement that the three change-over contacts A, B and C are set into a specified combination of positions. This may take place in known manner simultaneously or sequentially. The means used to this end which are known per se are not shown in FIGURE 2.

The arrangement operates as follows. For purposes of illustration, it is assumed that the code group 7, i.e. the group (110), is to be converted. The change-over contacts A, B and C are set into the positions 1, 1, 0, so that the write wires 22, 24 and 25 are marked. Then a current pulse of adequate intensity is passed through the reset wire 30, with the result that all rings are set to the position 1. The latter is achieved by transiently connecting the input terminal 28 to a voltage source of given polarity. After these preliminary operations, of which the order of succession is immaterial, the input terminal 20 is transiently connected to a voltage source, so that current pulses are passed through the marked wires 22, 24 and 25. In consequence all rings, with the exception of the ring 7 (which corresponds to the code group (110)), jump back into the state 0, since none of the marked writing wires is threaded through the ring 7, whereas at least one marked writing wire is threaded through each of the other rings. In order to illustrate that a current pulse passing through one of the write wires 21, 22 . . . 26 drives the rings through which this wire passes into the state 0, whereas a current pulse passing through the reset wire 30 drives all rings into the state 1, the oblique dashes indicating that a wire is passed through a ring have a different direction for the write wires 21, 22 . . . 26 on the one hand and for the reset wire 30 on the other hand. The desired effect may be obtained either by connecting the input terminals 20 and 28 to voltage sources of opposite polarities or by threading the writing wires 21, 22 . . . 26 through the rings in a sense differing from that of the reset wire 30. Finally the input terminal 29 is connected transiently to a voltage source of such polarity that a current pulse passes through the read-out wire 31 and drives all rings into the state 0. Only the ring 7 changes over, since the further rings are already in the state 0 at this instant. Thus a pulse is induced into the output wires 33 and 34, which are threaded through the ring 7. This means that the conversion has the figure 1 at the code element places *b* and *c*, corresponding to the output wires 33 and 34 and the figure 0 at the other code element places. The conversion is therefore (01100), in accordance with the table of FIG. 1.

From the foregoing it is evident that at the instant when the input terminal 20 is transiently connected to the voltage source, a pulse is induced into all output wires 32, 33, 34, 35 and 36 since all rings, with the exception of one, change over from the state 1 into the state 0, whereas at the instant when the input terminal 28 is transiently connected to a voltage source a pulse of opposite polarity is induced into all output wires 32, 33, 34, 35 and 36 since all rings change over from the state 0 into the state 1. The receiver of the conversions is preferably constructed so that it does not respond to the occurrence of pulses in all output wires 32, 33, 34, 35 and 36, but only to the occurrence of pulses in two of these five output wires. Then the self-checking character of the 2-out-of-5 code is utilised. However, if this does not take place, the output wires may be provided with mechanical or electronic switches, which are opened only at the instants that the input terminal 29 is transiently connected to a voltage source and the conversion is produced. This may take place in known manner; the means used thereto are therefore not shown in FIG. 2.

FIG. 3 shows an arrangement which differs from the arrangement shown in FIG. 2 only in that the three change-over contacts A, B and C are connected in series. This has the advantage of giving an indication of a possible defect in one of these change-over contacts consisting in its input terminal being connected to neither of the two output terminals or to both of the two output terminals. In the first case, a pulse is induced into all five output wires 32, 33, 34, 35, 36, while in the latter case, no pulse is introduced into any of said output wires. If the defect consists in that the defective change-over contact remains permanently in a given state, erroneous translations are delivered.

For some uses it is desirable or even necessary that the translation should be delivered sequentially. This is possible by repeating the arrangement shown in FIGS. 2 or 3 five times, as is illustrated in FIG. 4. The wires 21, 22 . . . 26, 30, 32, 33 . . . 36 of the five groups of 8 rings each thus formed, i.e. the groups $\mathbf{1}_a$, $\mathbf{2}_a$ . . . $\mathbf{8}_a$, $\mathbf{1}_b$, $\mathbf{2}_b$ . . . $\mathbf{8}_b$, $\mathbf{1}_c$, $\mathbf{2}_c$ . . . $\mathbf{8}_c$ . . . are connected in series, but each of these five groups of eight rings has an individual read-out wire, so that the arrangement comprises five read-out wires $\mathbf{31}_a$, $\mathbf{31}_b$, $\mathbf{31}_c$, $\mathbf{31}_d$, and $\mathbf{31}_e$, which are connected to the five input terminals $\mathbf{29}_a$, $\mathbf{29}_b$, $\mathbf{29}_c$, $\mathbf{29}_d$ and $\mathbf{29}_e$. In order to convert, for example, the code group 4, i.e. the code group (011), the terminal 28 is transiently connected to the voltage source concerned, so that all rings are set in the state 1 and the change-over contacts A, B and C are set in the positions 0, 1, 1; the write wires 21, 24, 26 are thus marked. Then also the terminal 20 is transiently connected to the voltage source concerned, so that all rings are reset in the state 0 with the exception of the rings $\mathbf{4}_a$, $\mathbf{4}_b$, $\mathbf{4}_c$, $\mathbf{4}_d$ and $\mathbf{4}_e$, which remain in the state 1. Then, in order of succession, the terminals $\mathbf{29}_a$, $\mathbf{29}_b$, $\mathbf{29}_c$, $\mathbf{29}_d$ and $\mathbf{29}_e$ are transiently connected to the voltage source concerned, so that also the rings $\mathbf{4}_a$, $\mathbf{4}_b$, $\mathbf{4}_c$, $\mathbf{4}_d$ and $\mathbf{4}_e$ jump successively back into the state 0. Then pulses are only induced into the wires 32 and 36, since only these wires pass through a ring 4, i.e. the rings $4_a$ and $4_e$. The conversion is therefore the code group (10001), which is delivered sequentially.

Figures 5, 6:
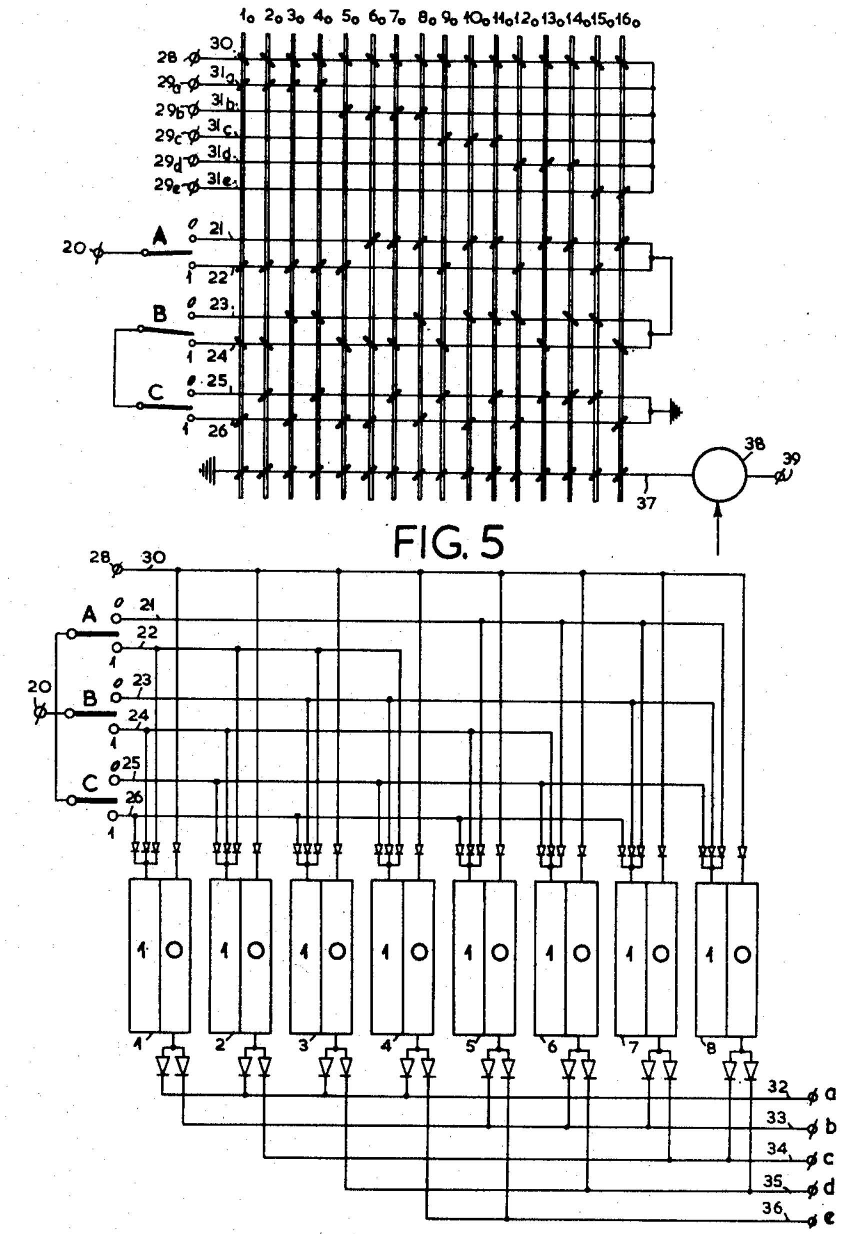
FIG. 6 shows a device for carrying out the same translation with trigger circuits used as memory elements.

From a closer consideration of FIG. 4 it is evident that there are a great number of rings through which no output wire is threaded. These are the rings $5_a$, $6_a$, $7_a$ and $8_a$, $2_b$, $3_b$, $4_b$, $8_b$, $1_c$, $3_c$, $4_c$, $5_c$, $6_c$, $1_d$, $2_d$, $4_d$, $5_d$, $7_d$, $1_e$, $2_e$, $3_e$, $6_e$, $7_e$, $8_e$. Since these rings do not play any part in the production of any translation, they may be omitted without affecting in any way the operation of the arrangement. The further rings are indicated in FIG. 4 by $1_0$, $2_0$, $3_0$ . . . $16_0$. FIG. 5 shows the diagram of the arrangement formed from that shown in FIG. 4 by omitting the redundant rings $5_a$, $6_a$ . . . $8_e$. Since in this case the translation is delivered sequentially, the five output wires may be replaced by a single output wire 37, which passes through all rings and includes a switch or gate 38, which is only opened at the instants when one of the input terminals $29_a$, $29_b$, $29_e$ is connected to the voltage source concerned. The output of the gate 38 is connected to an output terminal 39. Moreover, precautions must be taken to ensure that the receiving device can learn what code element place an incoming pulse relates to. This may be achieved by synchronizing the receiving device in known manner both with the pulses occurring across the reading-out wires $31_a$, $31_b$ . . . $31_e$ and with the opening and closing of the gate 38. As an alternative, each translation may be caused to start, in known manner, by a starting element having the value 1 and a stop element having the value 0.

Finally, FIG. 6 shows an arrangement similar to that of FIG. 2, the rings being replaced by trigger circuits which may be transistorized, f.i. circuits of the Eccles-Jordan type. Each of these trigger circuits may occupy two states, which are distinguished by the digits 0 and 1. Each trigger circuit includes furthermore a 1-input, by which it can be set into the state 1, a 0-input, by which it can be set into the state 0, and a 0-output, which has a high voltage when the trigger circuit is in the state 0 and a low voltage when the trigger circuit is in the state 1. The 1-inputs are connected via decoupled diodes to the outputs of the change-over contacts A, B and C in the same pattern as the writing wires are taken through the rings in the arrangement shown in FIG. 2. The 0-inputs are connected to the reset wire 30 also via decoupled diodes. The arrangement does not comprise a reading-out wire. The 0-outputs of the trigger circuits are connected to the output wires in the same pattern as the output wires are taken through the rings in the arrangement shown in FIG. 2.

If with this arrangement the code group (101) is to be converted, the change-over contacts A, B and C are set to the outputs 1, 0 and 1. By energizing the terminal 20, all trigger circuits will occupy the state 1, with the exception of the trigger circuit 6, which remains in the state 0. Thus, the output wires 32, 34 and 36 (corresponding to the code element places *a*, *c* and *e*) obtain a low voltage and the output wires 33 and 35 (corresponding to the code element places *b* and *d*) obtain a high voltage. The translation is therefore (01010) (see table in FIG. 1).

By including differentiating circuits in the output wires, the arrangement can be such that the conversions are delivered in the form of pulse code groups.

The decoupling of the inputs and outputs serves to prevent the state of one of the trigger circuits from affecting the state of a further trigger circuit.

From the foregoing it is evident that instead of using rings other memory elements, for example, trigger circuits, may be employed. It is readily evident that substantially any kind of memory element with a finite or infinite memory duration is suitable for constructing a translation arrangement according to the invention.

What is claimed is:

1. A code converter for converting an *m*-out-of-*n* code consisting of a first plurality of code groups each containing binary code elements into a *p*-out-of-*q* code consisting of a second plurality of code groups each containing binary code elements, neither *m* nor *p* being 1, comprising: a plurality of two-position contacts equal in number to the code elements in each of the first plurality of code groups, each position of said contacts corresponding to one value of a binary code element, each contact having two outputs, a plurality of binary memory elements, each memory element being associated with a code group of said first plurality and a corresponding code group of said second plurality, means for selectively coupling the outputs of said contacts to said memory elements, said outputs for a selected code group being coupled to inputs of said memory elements in a manner such that the memory element corresponding to said selected code group is not coupled to any of said outputs and at least one input of each of the other memory elements is coupled to one or more of said outputs, reset means coupled to all of said memory elements for resetting them to one stable position, read-out means coupled to all of said memory elements for setting them to a seconnd stable position, each code element place of each of said second plurality of code groups corresponding to an output coupling which is coupled to at least one memory element having as an output a given binary state, and not being coupled to any of the further memory elements, whereby each memory element is coupled only to output coupling which must supply an output representative of said given binary state.

2. A converter as claimed in claim 1, wherein said memory elements are all formed of rings of a magnetic material having a rectangular hysteresis loop, and the various couplings are achieved by threading a wire through a corresponding magnetic ring.

3. A code converter for delivering the converted code sequentially, comprising a plurality of converters as claimed in claim 1, with one memory element for each of said plurality of code groups, the reset couplings, the output couplings, and the coupling of the contacts being connected in series.

4. A converter according to claim 3, comprising only one output coupling.

5. A converter according to claim 2, each output coupling being connected to an output terminal through a gate, said gates being normally nonconductive and becoming conductive only when the associated coupling is energized corresponding to a particular state of a code element.

6. A converter as claimed as claim 1, said contacts being connected in series.

References Cited in the file of this patent

UNITED STATES PATENTS

| | | |
|---|---|---|
| 2,733,860 | Rajchman | Feb. 7, 1956 |
| 2,734,182 | Rajchman | Feb. 7, 1956 |
| 2,768,367 | Rajchman | Oct. 23, 1956 |
| 2,884,622 | Rajchman | Apr. 28, 1959 |
| 2,905,934 | Flint | Sept. 22, 1959 |
| 2,922,996 | Young | Jan. 26, 1960 |
| 2,953,778 | Anderson et al. | Sept. 20, 1960 |